United States Patent [19]

Sleighter

[11] Patent Number: 4,584,206
[45] Date of Patent: Apr. 22, 1986

[54] CHEMICAL VAPOR DEPOSITION OF A REFLECTIVE FILM ON THE BOTTOM SURFACE OF A FLOAT GLASS RIBBON

[75] Inventor: George E. Sleighter, Natrona Heights, Pa.

[73] Assignee: PPG Industries, Inc., Pittsburgh, Pa.

[21] Appl. No.: 636,039

[22] Filed: Jul. 30, 1984

[51] Int. Cl.$^4$ .................. C23C 16/00; B05D 5/12
[52] U.S. Cl. .................... 427/109; 118/715;
   427/160; 427/166; 427/255
[58] Field of Search .............. 427/109, 160, 166, 255;
   428/432; 118/715

[56] References Cited

U.S. PATENT DOCUMENTS

| | | | |
|---|---|---|---|
| 3,681,042 | 8/1972 | Edwards et al. | 65/60 |
| 3,850,679 | 11/1974 | Sopko et al. | 117/106 R |
| 3,852,098 | 12/1974 | Bloss et al. | 117/106 R |
| 3,888,649 | 6/1975 | Simhan | 65/60 |
| 3,942,469 | 3/1976 | Simhan | 118/48 |
| 4,130,673 | 12/1978 | Larkin | 427/255 |
| 4,144,362 | 3/1979 | Larkin | 427/226 |
| 4,206,252 | 6/1980 | Gordon | 427/160 |
| 4,294,193 | 10/1981 | Gordon | 118/718 |
| 4,325,988 | 4/1982 | Wagner | 427/160 |
| 4,344,986 | 8/1982 | Henery | 427/180 |
| 4,401,695 | 8/1983 | Sopko | 427/180 |

Primary Examiner—James R. Hoffman
Attorney, Agent, or Firm—Donna L. Seidel

[57] ABSTRACT

A method and apparatus are disclosed for depositing a metal-containing film on the bottom surface of a glass ribbon by chemical vapor deposition whereby a turbulent stream of vaporized coating reactant is delivered to the bottom surface of a glass ribbon at a sufficient temperature to cause deposition of a film on the surface, and unreacted and undeposited coating reactant and reaction by-products are immediately exhausted.

19 Claims, 3 Drawing Figures

CHEMICAL VAPOR DEPOSITION OF A REFLECTIVE FILM ON THE BOTTOM SURFACE OF A FLOAT GLASS RIBBON

BACKGROUND

The present invention relates generally to the art of chemical vapor deposition, and more particularly to the art of chemical vapor deposition of a reflective film.

U.S. Pat. No. 3,681,042 to Edwards et al discloses coating a surface of float glass by vaporizing a coating material, entraining the vapor in a stream of hot carrier gas, and directing the gas-borne coating material to the glass surface to be coated, which surface is at a coating-receptive temperature.

U.S. Pat. No. 3,850,679 to Sopko et al discloses depositing a metal oxide coating on a hot glass surface by applying a mixture of carrier air, vaporized solvent and vaporized metal-containing coating reactant to the hot glass surface through a nozzle at a Reynolds number exceeding 2500 with the nozzle-to-glass spacing at least 1.25 times the characteristic dimension of the nozzle.

U.S. Pat. No. 3,852,098 to Bloss et al discloses coating a glass substrate with a metal-containing film by heating the glass and contacting the glass with a gaseous mixture from 50 to 100 percent saturated with the vapors of a reactive metal compound at its temperature immediately before contacting the glass. The gaseous mixture is then heated by the glass to a sufficient temperature to cause the metal compound to react thereby depositing the film.

U.S. Pat. No. 3,888,649 to Simhan discloses an elongated converging nozzle having a contraction ratio of six or greater and having walls so shaped that a fluid flowing adjacent the walls through the nozzle is accelerated substantially throughout its passage. U.S. Pat. No. 3,942,469 to Simhan discloses an elongated converging nozzle as described above having walls shaped with increasing radii of curvature.

U.S. Pat. No. 4,130,673 to Larkin discloses decreasing the coefficient of friction and improving the scratch resistance of glass by applying finely divided or vaporized butyltin trichloride to heated glass articles to produce a coating of stannic oxide on the glass which is then overcoated with a conventional lubricating wax. U.S. Pat. No. 4,144,362 to Larkin discloses a method of producing a stannic oxide coating on a heated glass article using finely divided liquid monobutyltin trichloride wherein unpyrolyzed reactant is recovered for subsequent reuse.

U.S. Pat. No. 4,206,252 to Gordon describes transparent glass windows having a first coating of infrared reflective material displaying iridescence which is markedly reduced by provision of a layer of continuously varying refractive index between the glass and the coating. The invention also encompasses processes for making such windows. U.S. Pat. No. 4,294,193 to Gordon describes a vapor coating apparatus for producing the coated glass described above wherein a layer between the glass and the infrared reflective coating has a refractive index which increases continuously from the glass to the coating. The apparatus is described as suitable for use in making coatings of gradually changing compositions from gaseous reactants in general.

U.S. Pat. No. 4,325,988 to Wagner discloses a method and apparatus for producing a film on a substrate surface from a cloud of dust-sized particles of a coating reactant, preferably using a jet mill. U.S. Pat. No. 4,344,986 to Henery discloses a method for depositing a coating from a powder coating reactant wherein turbulence is created in the carrier gas stream.

U.S. Pat. No. 4,401,695 to Sopko discloses a method and apparatus for depositing a coating from a gaseous stream of powder coating reactant, wherein the carrier gas is supplied at a high volume rate and low pressure.

SUMMARY OF THE INVENTION

The present invention provides a method for the chemical vapor deposition of a metal-containing film on the bottom surface of a moving float glass ribbon. The coating apparatus comprises a slot-shaped nozzle for delivering coating reactant vapor positioned adjacent an integral exhaust collector. The delivery/exhaust integrated system fits between glass conveying rolls. The chemical vapor deposition of visibly reflective metal-containing film on the bottom surface of a float glass ribbon is particularly useful in conjunction with the deposition of an infrared-red reflective film on the top surface.

DETAILED DESCRIPTION OF THE PREFERRED EMBODIMENTS

Figure 1:
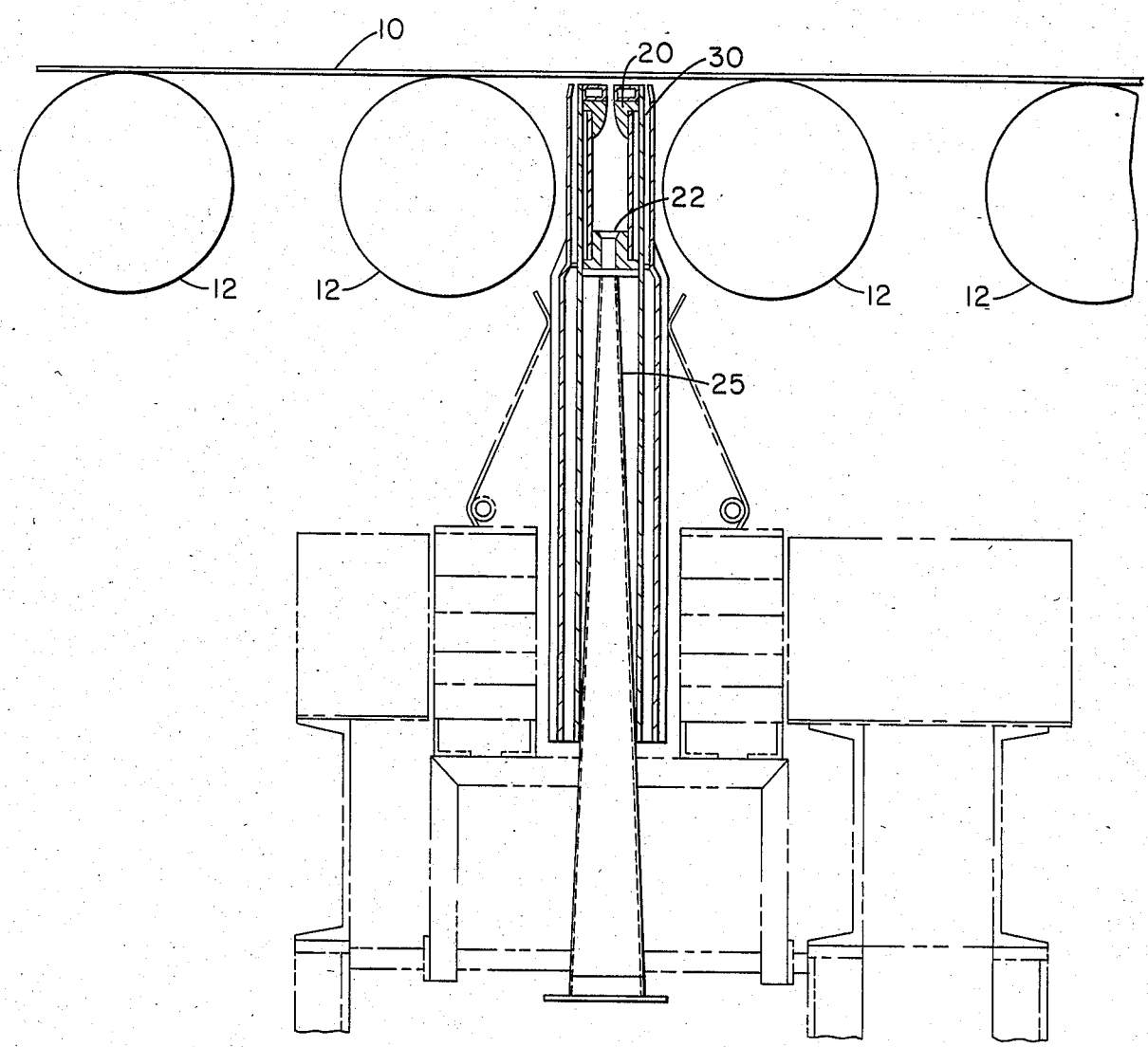
FIG. 1 is a cross-sectional view illustrating a ribbon of glass 10 being conveyed by rolls 12. Coating reactant vapor (not shown) passes through chamber 25 and distributor 22, and is delivered to the bottom surface of glass 10 by means of nozzle 20. An integral exhaust means 30 removes undeposited vapor.

A glass substrate, either a discreet glass sheet, or preferably a continuous float glass ribbon, is conveyed horizontally by means of conveying rolls through a coating station. In a float glass process, the coating station is preferably located between the bath exit canopy and the lehr entrance. Numerous methods are well-known in the art for coating the top surface of the glass, e.g., pyrolytic spray, powder coating, chemical vapor deposition, etc. The present invention provides a method for coating the bottom surface of the glass. In accordance with the present invention, a coating apparatus is installed between a pair of adjacent conveying rolls, preferably just past the lift-out rolls which lift the glass ribbon off the molten metal of the bath.

The coating apparatus of the present invention comprises a narrow chamber with a coating reactant inlet end, and an outlet end substantially as long as the width of the glass area to be coated. The chamber is supplied with a mixture of carrier gas and coating reactant vapor. The coating reactant is preferably vaporized before it enters the chamber in order to save the space that would be required to place vaporizing means in the chamber. The chamber is preferably tapered from a cylindrical-shaped inlet end to a narrow slot-shaped outlet end or nozzle which directs the vaporized coating reactant gaseous mixture to the glass surface to be coated. Suitable nozzles are described in detail in U.S. Pat. Nos. 3,850,679 to Sopko et al; 3,888,649 and 3,942,469 to Simhan, the disclosures of which are incorporated herein by reference. In a most preferred embodiment, a distributor is placed between the chamber and the nozzle to promote uniform distribution of the coating reactant vapor along the length of the nozzle. A preferred distributor is a structural element, positioned over the outlet end of the chamber, having a plurality of evenly spaced apertures through which the vapor passes into the nozzle. Preferably, the individual jets of coating reactant vapor and carrier gas are diffused before the mixture exits from the nozzle. Diffusion may be accomplished by means of diffuser elements in the inlet end of the nozzle, similar in configuration to the baffles shown in the powder coater of U.S. Pat. No. 4,344,986 to Henery, the disclosure of which is incorporated herein by reference.

The coating reactants which are preferred for chemical vapor deposition onto the bottom surface of glass in accordance with the present invention are pyrolyzable organometallic compounds. While organic compounds of metals of Groups Ib through VIIb and of Group VIII of the periodic chart may be employed, e.g., betadiketonates, acetates, hexoates, formates, etc., and particularly acetylacetonates of metals such as cobalt, iron and chromium, most preferred are organometallic compounds of tin. Many organometallic compounds which exist in solid form at ambient temperature may be employed in solution for vaporization and chemical vapor deposition.

A variety of aliphatic and olefinic hydrocarbons and halocarbons are suitable as solvents in carrying out the methods disclosed herein. Single component solvent systems, particularly a solvent system employing methylene chloride, are effectively employed in the present invention. Solvent systems employing two or more solvents are also found to be particularly useful. Some representative solvents which may be employed in carrying out the present invention are: methylene bromide, carbon tetrachloride, carbon tetrabromide, chloroform, bromoform, 1,1,1-trichloroethane, perchlorethylene, 1,1,1-trichloroethane, dichloroiodomethane, 1,1,2-tribromoethane, trichloroethylene, tribromoethylene, trichloromonofluorethane, hexochlorethane, 1,1,1,2-tetrachloro-2-chloroethane, 1,1,2-trichloro-1,2-dichloroethane, tetrafluorobromethane, hexachlorobutadiene, tetrachloroethane and the like. Other solvents may also be employed, particularly as mixtures of one or more organic polar solvents, such as an alcohol containing 1 to 4 carbon atoms and one hydroxyl group and one or more aromatic non-polar compounds, such as benzene, toluene or xylene. The volatility of these materials makes their use less preferred than the use of the above preferred halogenated hydrocarbons and halocarbons, but they have particular economic utility.

In one preferred embodiment of this invention, a solution of a reactive organometallic salt in an organic solvent is directed to a vaporizing chamber. The vaporizing chamber is constructed so as to provide a heating element which heats the space surrounding the element to a temperature sufficient to vaporize the coating solution within that space rather than vaporizing the liquid only in contact with the heating element itself. A carrier gas is directed across and away from the heater to intercept the coating composition to mix with it enhancing its rate of vaporization and to carry the vapors through the heater to the substrate to be coated. Vapors of the solvent and organometallic coating reactant are directed from the vaporizer to the chamber 25 shown in the drawing.

Some preferred organometallic compounds in accordance with the present invention are liquid at ambient temperature, and may be employed without the use of solvents. A particularly preferred organometallic compound is monobutyltin trichloride, a colorless liquid, characterized by an atmospheric boiling point of 430° F. (221° C.), a partial pressure of 0.1 atmosphere at 310° F. (154.4° C.), heat of vaporization of 14.5 kilocalories and entropy of vaporization of 29.4 Clausius per mole. Monobutyltin trichloride is preferably vaporized by contact with hot carrier gas, typically air, preferably maintained at a temperature below about 400° F. (204° C.) to avoid decomposition, typically about 385° F. (196° C.). Suitable vaporizers are described in detail in U.S. Pat. Nos. 3,970,037 to Sopko and 4,297,971 to Henery, the disclosures of which are incorporated herein by reference.

In a preferred embodiment of the present invention, a fraction of the total volume of heated carrier gas is mixed with the monobutyltin trichloride in a vaporizer comprising a coil of tubing immersed in hot oil. The heavily saturated mixture of coating reactant vapor and carrier gas is then diluted with additional heated carrier gas in the chamber en route to the nozzle which delivers the coating reactant to the glass surface.

The glass surface is at a temperature sufficient to cause the organometallic coating reactant to react and deposit a film on the glass surface, typically at least 400° C. (752° F.), preferably about 550° to 600° C. (1022° to 1112° F.). A relatively quiescent layer of gas adjacent the glass surface, known as the boundary layer, varies in temperature asymptotically from the ambient temperature in the coating station, about 200° to 300° C. (about 392° to 572° F.), to the glass surface temperature of from 400° to 600° C. (about 752° to 1112° F.). The apparent thickness of the boundary layer is less than about 1 millimeter. In chemical vapor deposition methods of the prior art, coating reactant vapors being delivered to the glass surface, as well as reaction by-products being exhausted, traveled through the boundary layer by diffusion. In contrast, in accordance with the present invention, a narrow jet of coating reactant vapor/carrier gas exiting from the nozzle creates turbulent flow which disrupts the boundary layer, accelerating contact and reaction of the coating reactant at the glass surface to deposit a film. Preferred nozzles are described in detail in U.S. Pat. Nos. 3,850,679 to Sopko et al and 3,888,649 and 3,942,469 to Simhan, the disclosures of which are incorporated herein by reference.

In accordance with the present invention, the Reynolds number which characterizes the flow of vapor as it exits from the nozzle toward the glass surface is sufficiently high to insure turbulent flow which disrupts the boundary layer. The Reynolds number is defined by the following equation:

$$N_{Re} = W \cdot \rho \cdot L / \eta.$$

The Reynolds number is dimensionless. The symbols W, $\rho$ and $\eta$ represent the flow velocity, the density and the dynamic viscosity of the flowing vapor; L is a characteristic length defined at the point where the other variables are determined. According to known principals of hydraulics, the characteristic dimension L which is relevant in the defined relationship is the hydraulic diameter which is defined as four times the cross-sectional area of the nozzle exit divided by the wetted perimeter of the nozzle exit. The flow, density and vapor viscosity are all characterized in the equation as the values of these properties at the nozzle exit. A Reynolds number of at least about 1700 insures turbulent flow, while a Reynolds number greater than 2500 is preferred to insure uniformity.

In order to minimize the possibility of contamination of the deposited film by unreacted or undeposited coating reactant or reaction by-products, the coating apparatus of the present invention comprises integral exhaust means. Adjacent the nozzle along substantially its entire length is an aperture maintained at a negative pressure to provide exhaust means for removing unreacted or undeposited coating reactant and reaction by-products from the coating site so that neither the freshly coated surface nor the approaching surface to be coated becomes contaminated. The exhaust means may also contribute to the turbulent flow at the coating site which disrupts the boundary layer. Since the chemical vapor deposition method of the present invention does not depend on diffusion of the coating reactant vapor through the normal boundary layer, it is not limited to coating reactants with high entropies of vaporization as disclosed in U.S. Pat. No. 3,852,098 to Bloss et al, the disclosure of which is incorporated herein by reference.

In a particularly preferred embodiment of the present invention, the method and apparatus of the present invention are employed to deposit a film on the bottom surface of glass while another film is being deposited substantially simultaneously on the top surface. The top surface of the glass may be coated with any of the variety of films such as metals and metal oxides well-known in the art by any of the well-known techniques such as pyrolytic spray and powder coating.

In a most preferred embodiment of the present invention, the method and apparatus of the present invention are employed to deposit a relatively high visible reflectance metal oxide film on the bottom surface of glass while an infrared reflective film is being deposited on the top surface. Specifically, the present invention is particularly well suited to the chemical vapor deposition of a thin, high visible reflectance film such as tin oxide on the bottom surface of glass to mask the interference color effects of an infrared reflective film, such as a thicker tin oxide film, on the top surface. The present invention is especially useful for the chemical vapor deposition of an essentially colorless, high visible reflectance interference color masking, thin tin oxide film on the bottom surface of a float glass ribbon in conjunction with the pyrolytic deposition of a thicker, infrared reflective tin oxide film on the top surface.

Preferred tin oxide infrared reflecting films in accordance with the present invention have a resistivity less than about 110 ohms per square, more preferably less than about 60 ohms per square, and a low emissivity, preferably less than 0.4. The thickness of the film is chosen to correspond with a minimum in the luminous reflectance curve which plots luminous reflectance as a function of film thickness. Preferably, the film thickness corresponds to the first minimum in the luminous reflectance curve since this point represents the lowest visible reflectance obtainable for a tin oxide film. This point corresponds with the second order blue interference effect at a thickness of about 1400 Angstroms. Coating process parameters are adjusted to yield the minimum resistivity for the given thickness to provide maximum infrared reflectance and minimum emissivity. If lower resistivity is desired for higher solar energy performance, a thicker infrared reflecting tin oxide film may be formed, preferably at a thickness near the second minimum in the luminous reflective curve, most preferably at the thickness corresponding with the third order blue interference effect, about 2750 Angstroms.

In the preferred embodiment wherein the thickness of the tin oxide infrared reflecting film corresponds with the first minimum in the spectral reflectance curve, the film typically appears blue by interference effects, the visible reflectance is about 10 percent, and the resistivity is generally about 45 to 50 ohms per square. In order to mask the visible iridescense of the infrared reflecting tin oxide film on the top glass surface, the bottom glass surface is coated with a uniformly and significantly more highly reflecting film, preferably with a luminous reflectance greater than about 15 percent, preferably about 18 to 21 percent. Preferably, the masking film is a colorless film, i.e., one with a relatively flat spectral curve in the range of visible wavelengths and having a reflected luminance near 1.0. If a thicker infrared reflecting film, e.g., a tin oxide film with a resistivity of 20 to 30 ohms per square and reflectance of about 12 percent which appears reddish blue by interference effects, is desired to lower the emissivity, a more highly reflective masking film maybe needed, for example, a film with a luminous reflectance greater than about 25 percent, such as a titanium oxide film.

Interference masking films preferred in accordance with the present invention, in addition to being colorless and more visibly reflective than the infrared reflecting film, are also preferably non-absorbing, i.e., having an absorbance less than about 25 percent, in order to maintain a high transmittance of visible light. A finished article comprising two sheets of clear glass, a tin oxide infrared reflecting film and a substantially colorless masking film preferably has a visible transmittance of at least about 60 percent, and more preferably about 70 percent for residential use. Interference masking is described in detail in U.S. application Ser. No. 518,592 filed July 29, 1983 by Michelotti and Henery, the disclosure of which is incorporated herein by reference. The top infrared reflective tin oxide film is preferably applied using powder coating reactants as disclosed in U.S. Pat. Nos. 4,325,988 to Wagner; 4,344,986 to Henery; and preferably 4,401,695 to Sopko, the disclosures of which are incorporated herein by reference.

The present invention will be further understood from the descriptions of specific examples which follow.

EXAMPLE I

In a laboratory scale experiment, liquid monobutyltin trichloride is vaporized by injection into a stream of carrier air heated to 300° to 350° F. (about 149° to 177° C.). The monobutyltin trichloride vapor is delivered at a pressure of 5 to 10 pounds per square inch to heated manifolds which distribute the vapor through a plenum chamber to a nozzle which directs the vapor to the bottom surface at a glass substrate to be coated. The system is designed to provide uniform distribution of vapor over the full length of the nozzle. The nozzle is slot shaped, 14 inches (about 36 centimeters) long by ⅛ inch (about 3 millimeters) wide, and spaced 5/16 inch (about 8 millimetrs) from the glass surface to be coated. The nozzle is designed to provide turbulent flow of the gaseous mixture. The nozzle supplies coating reactant at a rate of 1.28 cubic centimeters per square foot of glass coated, and carrier air at a rate of about 2.33 standard cubic feet per square foot. Glass substrates measuring 16 by 40 inches (about 40.6 by 101.6 centimeters) are coated at a line speed of 240 inches (6.1 meters) per minute. The temperature of the glass surface being coated is maintained at 1075° F. (about 579° C.). The gaseous mixture of coating reactant vapor and air, after contacting the glass surface and depositing a tin oxide film, flows along the glass surface in a direction perpendicular to the length of the nozzle to an integral exhaust collector adjacent the nozzle. The exhaust system is operated at a negative pressure of 0.5 inch (12.7 millimeters) of water. Immediate removal of unreacted and/or undeposited coating reactant and/or reaction by-products minimizes process contamination which can result in defects such as roll making in the coated product. The resultant tin oxide coating in this example is about 600 Angstroms thick, is colorless and texture-free, and has a luminous reflectance of about 20 percent.

EXAMPLE II

Figure 2:
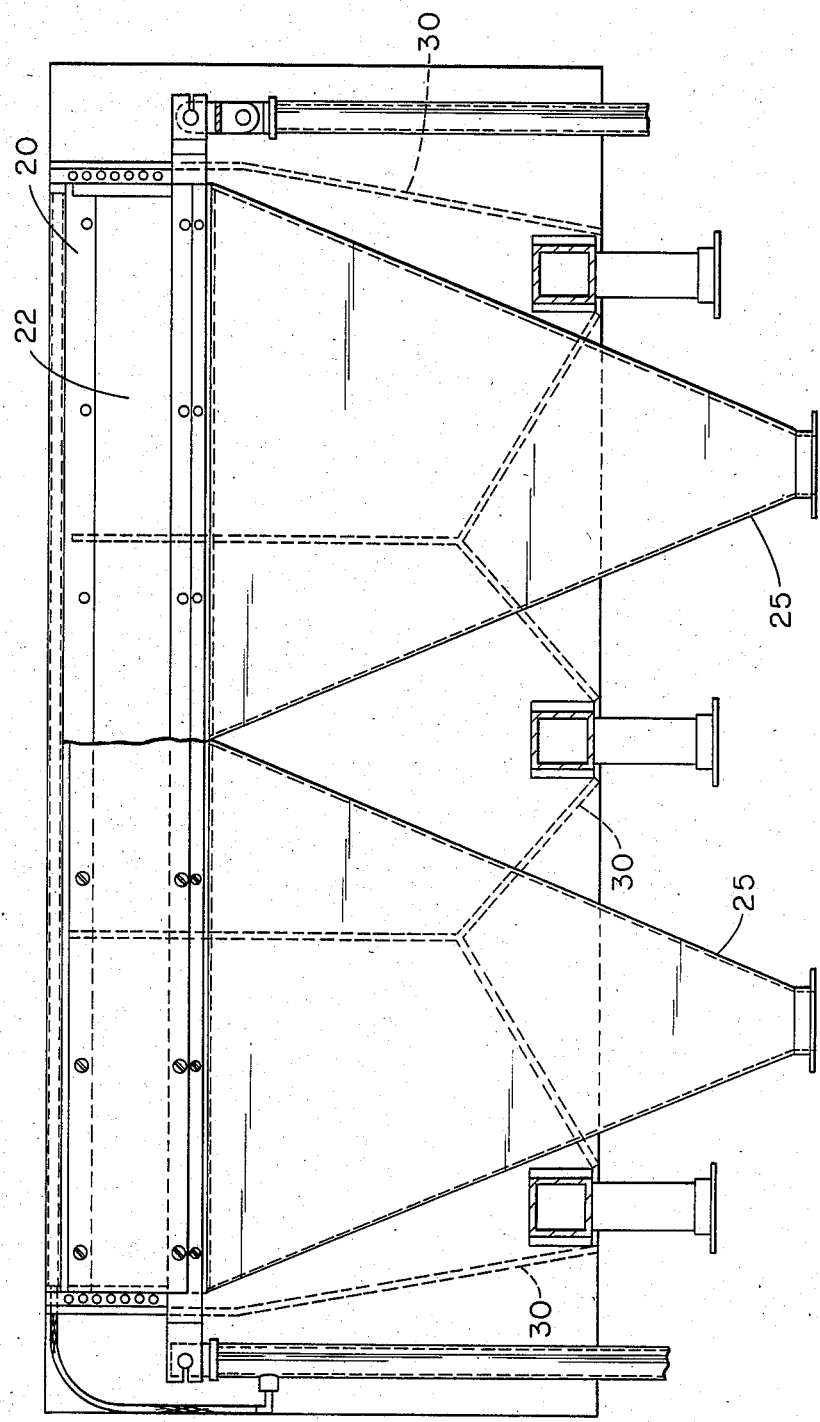
FIG. 2 is a view perpendicular to the direction of FIG. 1 showing the configuration of two adjacent chambers 25 equipped with distributors 22 and nozzles 20. Exhaust means 30 are illustrated in three sections, each having an outlet for connection with vacuum means (not shown).

A commercial scale coating process is set up as illustrated in FIGS. 1 and 2. Liquid monobutyltin trichloride is mixed in equal parts by volume with a solvent which is equal parts by volume of methylene chloride and trichloroethylene. Coating reactant solution is supplied at a rate of 37 cubic centimeters per minute per foot of nozzle length and carrier air is supplied at a rate of 32 standard cubic feet per minute per foot of nozzle length. The coating reactant/carrier air mixture pass through a vaporizer which consists of 30 feet (about 9.1 meters) of 1 inch (2.54 centimeters) diameter copper tubing immersed in oil at a temperature of 385° F. (about 196° C.). From the vaporizer, the coating reactant vapor/carrier gas mixture enters the chamber through a 4 inch (10 centimeter) diameter inlet end. The chamber tapers in two dimensions to a slot-shaped outlet end measuring about 3 feet (0.9 meters) by 1 inch (2.54 centimeters). A distributor comprising a T-shaped strip having ¾ inch (1.9 centimeter) apertures spaced 1½ inches (3.8 centimeters) apart is placed between the chamber and the nozzle to insure uniform distribution of the vapor to the nozzle. The nozzle in this example has a slot-shaped exit measuring 3 feet (0.91 meters) in length and 0.12 inches (about 3 millimeters) in width. The nozzle exit is spaced ¾ inch (about 1.9 centimeters) from the glass surface to be coated. The glass surface temperature is about 1100° F. (about 593° C.) measured before it reaches the coating station. The coating reactant vapor/carrier air temperature is about 350° F. (about 167° C.) measured at the nozzle exit. A float glass ribbon 4.5 millimeters thick traveling at a line speed of 215 inches (about 5.5 meters) per minute is coated in this example. After the coating reactant vapor/carrier gas mixture contacts the glass surface, it is removed through an integral exhaust system, adjacent and parallel to the nozzle, maintained at a negative pressure of 1.8 inches (4.6 centimeters) of water. A silver-blue tin oxide film is deposited on the glass surface having a resistivity of about 5000 ohms per square and a luminous reflectance of about 18 percent.

EXAMPLE III

Figure 3:
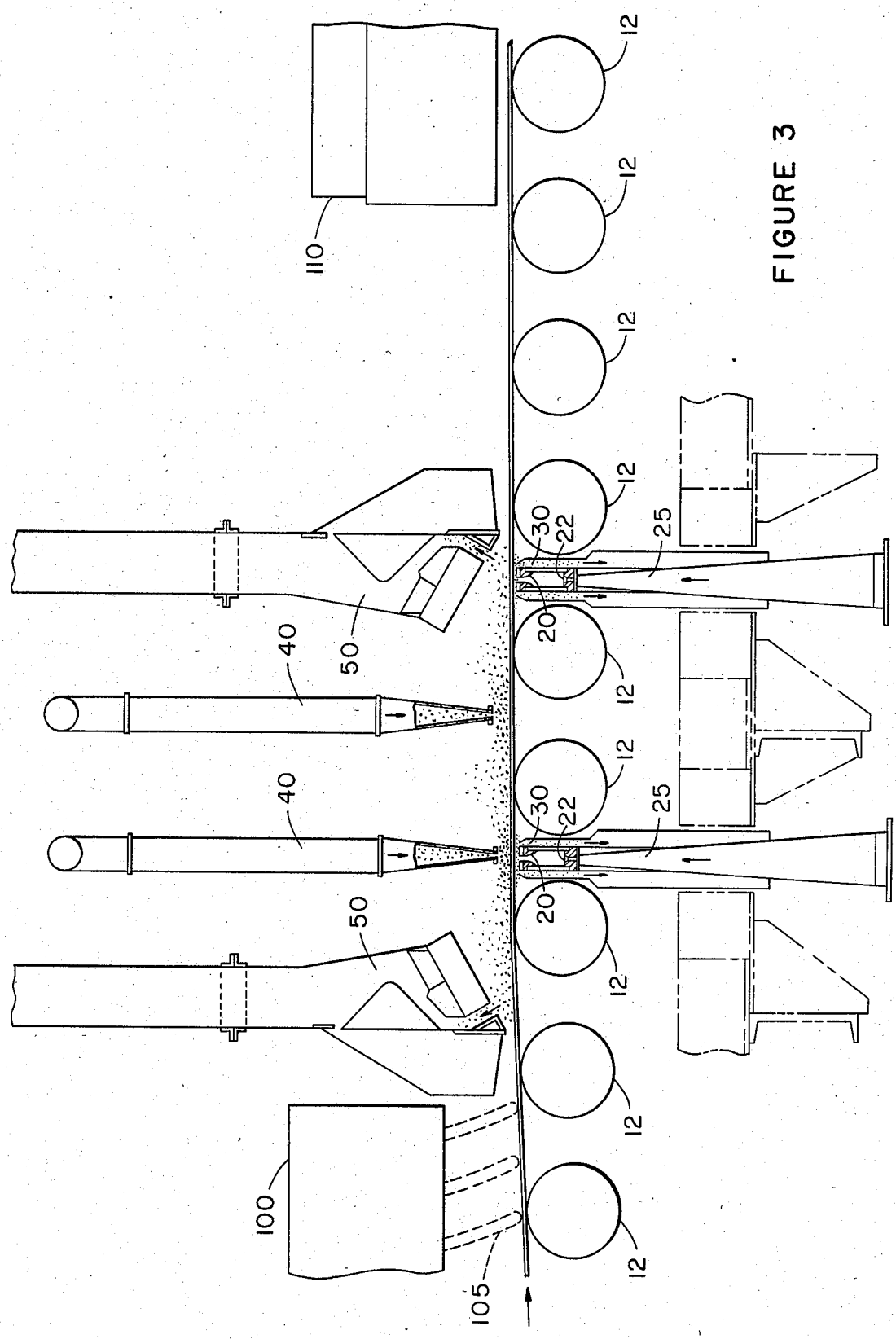
FIG. 3 is a cross-sectional view illustrating a ribbon of glass 10 being conveyed by rolls 12 from bath exit 100 under curtains 105 to lehr 110 in a float process. Two vapor coating chambers 25 equipped with distributors 22, nozzles 20 and exhaust means 30 are positioned between pairs of rolls 12. Two coaters 40 are positioned above the glass 10 to deposit coating reactant on the top surface of the glass 10. Exhaust means 50 remove undeposited coating reactant and reaction products.

A reflective tin oxide film is deposited on the bottom surface of a float glass ribbon by chemical vapor deposition as in Example II, except that the coating reactant/solvent ratio is about 1:10 and the solvent is perchloroethylene. Simultaneously, a thicker, infrared reflective tin oxide film is deposited by pyrolysis on the top surface of the glass. In this example, powdered dibutyltin difluoride is applied to the top surface of the glass while vaporized monobutyltin trichloride is applied to the bottom surface using pairs of coaters as illustrated in FIG. 3 to coat a 6 foot (1.8 meter) wide portion along the continuous length of the glass ribbon. The tin oxide coating on the top surface is deposited to a preferred thickness having a minimum reflectance, typically about 8 percent, exhibiting a second order blue interference color, having a surface resistivity less than about 110 ohms per square, preferably about 60 ohms per square. The top coating is an effective infrared reflective film to provide low emissivity to the coated glass, while the bottom coating is sufficiently colorless and reflective to mask the interference color of the top coating. The combined reflectance of the two films is sufficiently low so that a coated clear glass substrate will be a high transmittance article, having a luminous transmittance of about 70 percent.

The above examples are offered to illustrate the present invention. Various coating reactants, solvents, carrier gases and reaction conditions may be employed to deposit a variety of metal-containing films in accordance with the methods of the present invention. The apparatus as illustrated may be modified, e.g., in size, shape, number and position of coaters, without departing from the scope of the present invention which is defined by the following claims.

I claim:

1. A method for coating a glass substrate comprising the steps of:
   a. maintaining said glass substrate in a substantially horizontal position;
   b. maintaining said glass substrate at a temperature sufficient to cause a vaporized coating reactant to react and deposit a film on the glass surface;
   c. vaporizing a coating reactant;
   d. creating turbulent flow of the vaporized coating reactant;
   e. delivering said vaporized coating reactant to the bottom surface of said glass substrate whereupon said reactant reacts to deposit a uniform film; and
   f. immediately removing unreacted and undeposited coating reactant vapor and reaction by-products through exhaust means.

2. The method according to claim 1, wherein said glass is coated with a metal-containing film.

3. The method according to claim 2, wherein said glass is coated with a metal oxide film.

4. The method according to claim 3, wherein said coating reactant is an organometallic compound.

5. The method according to claim 4, wherein said coating reactant is vaporized by mixing and heating with a carrier gas.

6. The method according to claim 5, wherein said carrier gas comprises air.

7. The method according to claim 6, wherein said glass is coated with a tin oxide film.

8. The method according to claim 7, wherein said organometallic coating reactant is monobutyltin trichloride.

9. The method according to claim 8, wherein said monobutyltin trichloride is dissolved in a solvent, and the resultant solution is vaporized.

10. The method according to claim 9, wherein said solvent is selected from the group consisting of methylene chloride, trichloroethylene, perchloroethylene and mixtures thereof.

11. An apparatus for depositing a film on a surface of a substrate comprising:
   a. means for vaporizing a coating reactant;
   b. means for delivering said vaporized coating reactant to said substrate surface, said means comprising a nozzle having a slot-shaped orifice substantially as long as the parallel dimension of the substrate to be coated and capable of creating turbulent flow; and
   c. exhaust means adjacent said nozzle and extending substantially completely along the length of said nozzle wherein said nozzle and exhaust means are positioned between conveying means which support said substrate in order to coat the supported surface of said substrate.

12. The apparatus according to claim 11, wherein said nozzle is designed to deliver said vaporized coating reactant at a Reynolds number of at least 1700.

13. A method for producing a high transmittance, low emissivity coated glass article comprising the steps of:
   a. conveying a glass substrate in a substantially horizontal position through a coating area;
   b. maintaining said glass substrate at a temperature sufficient to cause a metal-containing coating reactant to react and deposit a metal-containing film on a surface thereof;
   c. contacting the top surface of said glass substrate with a metal-containing coating reactant which reacts to deposit an infrared reflective metal oxide film thereon, which film exhibits a visible interference color effect in reflectance; and
   d. substantially simultaneously contacting the bottom surface of said glass substrate with a vaporized metal-containing coating reactant which reacts to deposit a uniform higher reflectance metal oxide film which masks the visible interference color effect of the infrared reflective metal oxide film on the top surface.

14. The method according to claim 13, wherein the reflective metal oxide film on the bottom glass surface is selected from the group consisting of tin oxide and titanium oxide.

15. The method according to claim 14, wherein the luminous reflectance of the bottom surface film is from 15 to 21 percent.

16. The method according to claim 15, wherein the bottom surface film is tin oxide formed from vaporized monobutyltin trichloride.

17. The method according to claim 13, wherein the top surface film is tin oxide having a surface resistivity not greater than 110 ohms per square and a luminous reflectance not greater than 12 percent.

18. The method according to claim 17, wherein the top surface tin oxide film is formed by the pyrolysis of a powder organotin compound.

19. The method according to claim 18, wherein the organotin compound is dibutyltin difluoride.

* * * * *